(12) United States Patent
Tanaka et al.

(10) Patent No.: US 8,427,258 B2
(45) Date of Patent: Apr. 23, 2013

(54) SURFACE ACOUSTIC WAVE DEVICE AND COMMUNICATION DEVICE

(75) Inventors: Hiroyuki Tanaka, Kyoto (JP); Takehiro Okumichi, Kyoto (JP)

(73) Assignee: Kyocera Corporation, Kyoto (JP)

( * ) Notice: Subject to any disclaimer, the term of this patent is extended or adjusted under 35 U.S.C. 154(b) by 510 days.

(21) Appl. No.: 12/670,103

(22) PCT Filed: Jun. 30, 2008

(86) PCT No.: PCT/JP2008/061854
§ 371 (c)(1),
(2), (4) Date: May 18, 2010

(87) PCT Pub. No.: WO2009/013974
PCT Pub. Date: Jan. 29, 2009

(65) Prior Publication Data
US 2010/0219912 A1   Sep. 2, 2010

(30) Foreign Application Priority Data

Jul. 26, 2007 (JP) ................................. 2007-194327
Dec. 7, 2007 (JP) ................................. 2007-316788

(51) Int. Cl.
*H03H 9/72* (2006.01)
*H03H 9/64* (2006.01)

(52) U.S. Cl.
USPC .................... 333/133; 333/195; 310/313 D (58) Field of Classification Search .......... 333/193–196, 333/133; 310/313 BD
See application file for complete search history.

(56) References Cited

U.S. PATENT DOCUMENTS

| | | | | |
|---|---|---|---|---|
| 5,790,000 | A * | 8/1998 | Dai et al. | 333/193 |
| 6,268,782 | B1 * | 7/2001 | Hartmann et al. | 333/193 |
| 6,667,673 | B1 * | 12/2003 | Strauss | 333/195 |

(Continued)

FOREIGN PATENT DOCUMENTS

| | | |
|---|---|---|
| JP | 06-268476 | 9/1994 |
| JP | 08-079000 | 3/1996 |

(Continued)

OTHER PUBLICATIONS

English language Abstract Only for JP 06-268476 published Sep. 22, 1994.*

(Continued)

*Primary Examiner* — Barbara Summons
(74) *Attorney, Agent, or Firm* — DLA Piper LLP (US)

(57) ABSTRACT

An SAW device includes: a piezoelectric substrate 1; a first and a second SAW elements 2, 3 having three or more odd-number IDT electrodes 4-9 and reflector electrodes 10-13 arranged on the piezoelectric substrate 1; lines 16 which cascade-connect the first and the second SAW elements 2, 3; a first unbalanced signal terminal 14 connected to the IDT electrodes 4, 6 arranged at the both ends of the first SAW elements 2; and a second unbalanced signal terminal 15 connected to the IDT electrodes 7, 9 arranged at the both ends of the second SAW element 3. In each of the first and the second SAW elements 2, 3, one bus bar electrode 17 of each of center IDT electrodes 5, 8 is split into two, and non-split bus bar electrodes 18, 19 of at least one center IDT electrode of the first and the second SAW elements 2, 3 are connected to a reference potential electrode and the lines 16 are made to be balanced signal lines.

17 Claims, 9 Drawing Sheets

U.S. PATENT DOCUMENTS

| | | | |
|---|---|---|---|
| 6,781,485 B2 * | 8/2004 | Takamine et al. | 333/195 |
| 6,791,437 B2 * | 9/2004 | Hagn et al. | 333/195 |
| 6,828,879 B2 * | 12/2004 | Tanaka et al. | 333/195 |
| 6,879,086 B2 * | 4/2005 | Takamine | 310/313 D |
| 7,369,015 B2 * | 5/2008 | Takamine | 333/193 |
| 7,467,447 B2 * | 12/2008 | Nakano et al. | 29/25.35 |
| 7,518,470 B2 | 4/2009 | Makibuchi et al. | |
| 8,031,034 B1 * | 10/2011 | Solal et al. | 333/193 |
| 2004/0155730 A1 | 8/2004 | Iwamoto et al. | 333/193 |
| 2004/0196119 A1 | 10/2004 | Shibahara et al. | 333/193 |
| 2007/0171003 A1 | 7/2007 | Takamine | 333/195 |
| 2007/0290770 A1 * | 12/2007 | Otsuka et al. | 333/193 |

FOREIGN PATENT DOCUMENTS

| | | |
|---|---|---|
| JP | 11239035 A | 8/1999 |
| JP | 2002-084163 | 3/2002 |
| JP | 2003-249842 | 9/2003 |
| JP | 2004-282707 | 10/2004 |
| JP | 2006086994 A | 3/2006 |
| JP | 2007181195 A | 7/2007 |
| WO | WO 2006/043445 A1 | 4/2006 |

OTHER PUBLICATIONS

Japanese language office action dated Mar. 21, 2012 and its English language translation issued in corresponding Japanese application 2009524431.

Japanese language office action dated Jun. 12, 2012 and its English language translation issued in corresponding Japanese application 2009524431 cites the foreign patent documents above.

* cited by examiner

SURFACE ACOUSTIC WAVE DEVICE AND COMMUNICATION DEVICE

CROSS-REFERENCE TO THE RELATED APPLICATIONS

This application is a national stage of international application No. PCT/JP2008/061854, filed on Jun. 30, 2008, and claims the benefit of priority under 35 USC 119 to Japanese Patent Application No. 2007-194327, filed on Jul. 26, 2007 and Japanese Patent Application No. 2007-316788, filed on Dec. 7, 2007, the entire contents of all of which are incorporated herein by reference.

TECHNICAL FIELD

The present invention relates to a surface acoustic wave device including a surface acoustic wave filter and a surface acoustic wave resonator etc. used in a mobile phone or other mobile communication device, for example, and a communication device provided with this.

BACKGROUND ART

Conventionally, as a frequency selection filter (below, also referred to as a "filter") used in an RF (radio frequency) stage of a mobile phone, car phone, or other mobile communication device, a SAW filter has been widely used. In general, as the characteristics required for a frequency selection filter, there can be mentioned a broad pass band, low loss, high amount of attenuation, and other characteristics.

Figure 8:
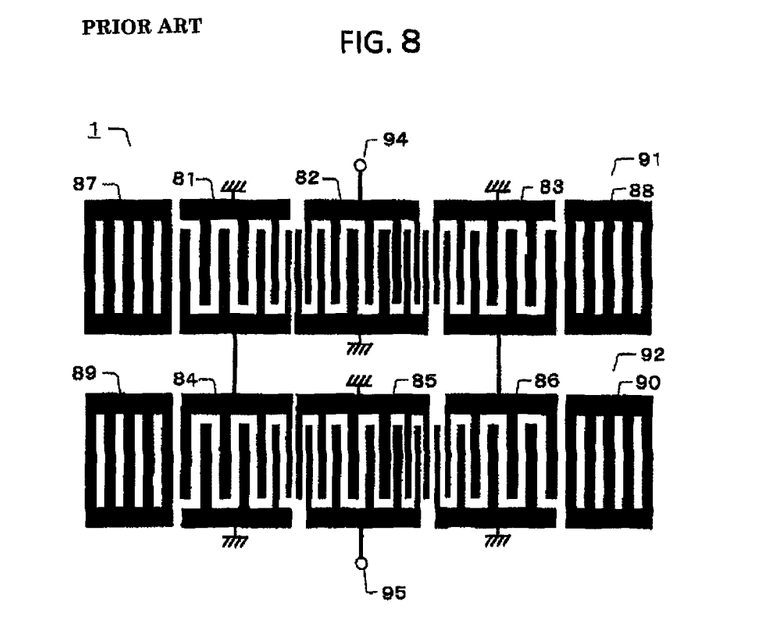
FIG. 8 A plan view showing an example of a conventional SAW device.

FIG. 8 shows a plan view of an electrode structure of a conventional resonator type SAW filter. In the conventional SAW filter shown in FIG. 8, a first SAW element 91 and a second SAW element 92 are cascade-connected in two stages, an unbalanced input terminal 94 is connected to an IDT electrode 82 located at the center of the first SAW element 91, and an unbalanced output terminal 95 is connected to an IDT electrode 85 located at the center of the second SAW element 92 (see, for example, Patent Document 1).

In this way, by cascade-connecting resonator electrode patterns in two stages, interference of standing waves of the first stage and the second stage occurs. This enables a high attenuation of an amount of out-of-band attenuation, and the amount of out-of-band attenuation of the filter characteristic can be improved. Namely, by employing a configuration in which SAW filters having the same characteristics are cascade-connected in two stages, the signal attenuated in the first stage is further attenuated in the second stage, so the amount of out-of-band attenuation can be improved about two-fold.
Patent Document 1: Japanese Patent Publication (A) No. 2002-84163

DISCLOSURE OF THE INVENTION

Problem to be Solved by the Invention

In the case of the conventional SAW filter shown in FIG. 8, ground terminals connected to the center IDT electrode are at positions adjacent to each other. For this reason, a capacitive component is generated between the ground terminals, so the amount of out-of-band attenuation of the SAW filter tended to become smaller. When such a SAW filter is assembled in a communication device constituted as a mobile phone terminal, this has an effect upon a speech quality of the mobile phone terminal, therefore a SAW filter having a large amount of out-of-band attenuation has been demanded.

The present invention provides a surface acoustic wave device capable of responding to the above needs and a communication device using the same.

Means for Solving the Problem

A surface acoustic wave device according to an embodiment of the present invention is provided with a piezoelectric substrate having a first region and having second and third regions arranged adjoining both sides of the first region; a first surface acoustic wave element which is arranged in the second region on the piezoelectric substrate, in which first, second, and third IDT electrodes are sequentially arranged along a direction of propagation of the surface acoustic wave propagated on the piezoelectric substrate and in which the second IDT electrode arranged at the center among the first, second, and third IDT electrodes includes first split bus bar electrodes arranged on the first region side on the piezoelectric substrate and split into two and a non-split bus bar electrode arranged in the second region on the piezoelectric substrate and connected to a reference potential electrode arranged in the second region; a second surface acoustic wave element which is arranged in the third region on the piezoelectric substrate, in which fourth, fifth, and sixth IDT electrodes are sequentially arranged along the direction of propagation of the surface acoustic wave propagated on the piezoelectric substrate and in which the fifth IDT electrode arranged at the center among the fourth, fifth, and sixth IDT electrodes includes second split bus bar electrodes arranged on the first region side so as to adjoin the first split bus bar electrodes and a non-split bus bar electrode arranged at the third region side on the piezoelectric substrate; balanced signal lines arranged in the first region and connecting the first split bus bar electrodes and the second split bus bar electrodes to thereby cascade-connect first and second surface acoustic wave elements; a first unbalanced signal terminal connected to the first and third IDT electrodes of the first surface acoustic wave element and arranged in the second region; and a second unbalanced signal terminal connected to the fourth and sixth IDT electrodes of the second surface acoustic wave element and arranged in the third region.

Further, a communication device according to an embodiment of the present invention is provided with at least one of a reception circuit and a transmission circuit having the above surface acoustic wave device.

Effects of the Invention

According to the SAW device according to an embodiment of the present invention, charges generated at the center IDT electrode can be released to the reference potential electrode. Thus, a SAW device having a large amount of out-of-band attenuation and excellent in electric characteristics can be obtained.

Further, it becomes unnecessary to provide a reference terminal electrode between the first and second SAW elements, therefore there is almost no generation of a capacitive component between the reference potential electrodes as in the conventional device. As a result, a SAW device in which the amount of out-of-band attenuation of the SAW filter becomes large and which is excellent in electric characteristics can be achieved.

Further, by the first SAW element and the second SAW element being connected by the balanced signal lines, even when the non-split bus bar electrode of the center IDT electrode and the bus bar electrodes connected to the reference potential electrodes of the IDT electrodes at the two ends are connected to the reference potential electrode through an inductance component, the potential of the non-split bus bar electrode of the center IDT electrode matches with the reference potential of the balanced signal and is constant. For this reason, impedance matching of the SAW filter can be sufficiently performed without obstructing matching of impedance with respect to the unbalanced signal terminal.

According to the communication device according to an embodiment of the present invention, a communication device having a good sensitivity can be realized.

EXPLANATION OF REFERENCE

1: piezoelectric substrate
2, 3: SAW elements
4 to 9: IDT electrodes
10 to 13: reflector electrodes
14: first unbalanced signal terminal
15: second unbalanced signal terminal
41: SAW resonator

BEST MODE FOR CARRYING OUT THE INVENTION

Below, a SAW device in an embodiment of the present invention is explained in detail with reference to the drawings. Further, in the present embodiment, as the SAW device, a resonator type SAW filter is explained as an example. Note that, in the drawings explained below, parts of the same configuration are assigned the same notations. Further, the sizes of the electrodes, distance between electrodes, numbers and interval of electrode fingers, etc. are diagrammatically shown for explanation.

Figure 1:
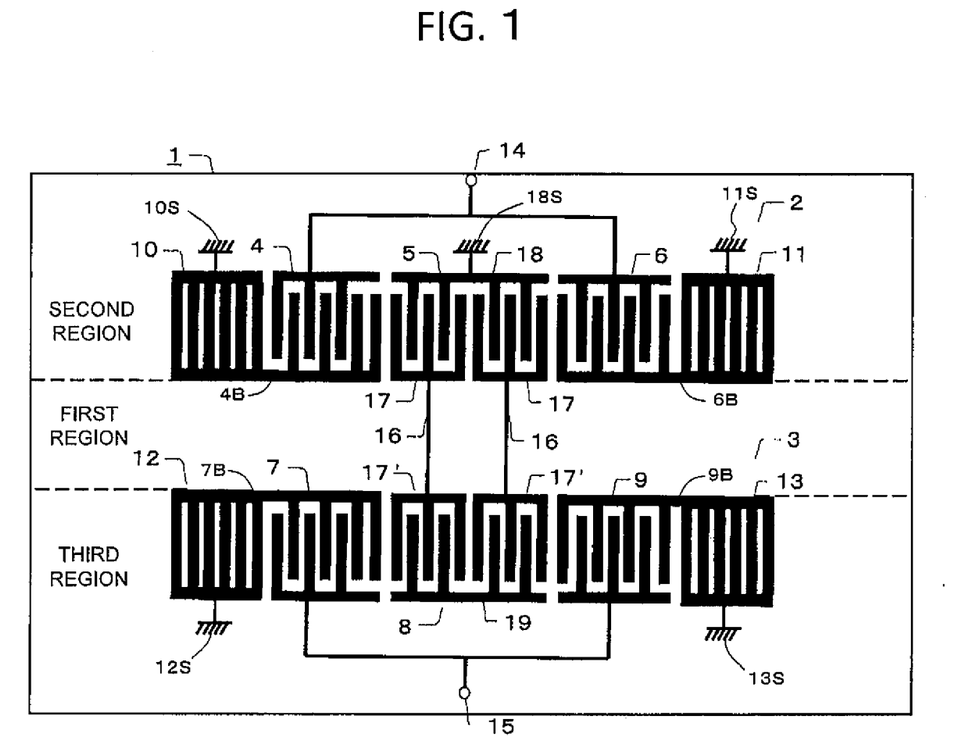
FIG. 1 A plan view showing an example of a SAW device in an embodiment of the present invention.

The SAW device shown in FIG. 1 has first and second SAW elements 2 and 3. Note that, in the drawing, a border of a first region and a second region and a border of the first region and a third region are indicated by dotted lines. The first SAW element 2 has, on the piezoelectric substrate 1, first, second, and third IDT electrodes 4, 5, and 6 provided with pluralities of, electrode fingers arranged along the direction of propagation of the SAW propagated on the piezoelectric substrate 1. Further, the second SAW element 3 has, on the piezoelectric substrate 1, fourth, fifth, and sixth IDT electrodes 7, 8, and 9 provided with pluralities of electrode fingers arranged along the direction of propagation of the SAW propagated on the piezoelectric substrate 1. Further, the SAW device shown in FIG. 1 has first and second reflector electrodes 10 and 11 arranged on the two sides of the first, second, and third IDT electrodes 4 to 6 and provided with pluralities of electrode fingers and third and fourth reflector electrodes 12 and 13 arranged on the two sides of the fourth, fifth, and sixth IDT electrodes 7 to 9 and provided with pluralities of electrode fingers. The electrode fingers belonging to the first to third IDT electrodes 4 to 6 and the fourth to sixth IDT electrodes 7 to 9 and the electrode fingers belonging to the first to fourth reflector electrodes 10 to 13 are arranged so that their longitudinal directions are along the direction perpendicular to the direction of propagation. Further, the SAW device shown in FIG. 1 further has balanced signal lines 16 making cascade connection between the first and second SAW elements 2 and 3, a first unbalanced signal terminal 14 connected to the first and third IDT electrodes 4 and 6 at the two ends among the three IDT electrodes 4 to 6 of the first SAW element 2 and arranged in the second region, and a second unbalanced signal terminal 15 connected to the fourth and sixth IDT electrodes 7 and 9 at the two ends among the three IDT electrodes 7 to 9 of the second SAW element 3 and arranged in the third region. Note that, the first unbalanced signal terminal 14 is, for example, an unbalanced signal input terminal, and the second unbalanced signal terminal 15 is, for example, an unbalanced signal output terminal.

The second IDT electrode 5 located at the center of the first SAW element 2 has first split bus, bar electrodes 17 and 17 split into two and arranged in the first region side. On the other hand, the fifth IDT electrode 8 located at the center of the second SAW element 3 has second split bus bar electrodes 17' and 17' split into two and arranged in the first region side. These split first and second bus bar electrodes 17, 17, 17', and 17' are arranged so as to planarly face each other via the balanced signal lines 16. The fifth IDT electrode 5 located at the center of the first SAW element 2 further has a non-split bus bar electrode 18. The non-split bus bar electrode 18 is connected to a reference potential electrode 18S arranged in the second region.

The non-split bus bar electrode 18 of the first SAW element 2 is connected to the reference potential electrode 18S, therefore charges generated in the IDT electrode 5 can be released to the reference potential electrode 18S, so the effect of charges generated at the IDT electrodes 5 and 8 exerted between the first SAW element 2 and the second SAW element 3 can be reduced. As a result, the amount of out-of-band attenuation becomes large.

Further, it becomes unnecessary to provide a reference potential electrode between the first and second SAW elements 2 and 3, therefore a capacitive component generated between the reference potential electrodes can be made smaller. As a result, the amount of out-of-band attenuation of the SAW filter becomes large, so a SAW device excellent in electric characteristics can be obtained.

Further, the space between the first and second SAW elements 2 and 3 can be made smaller, therefore there is also the advantage that the SAW device can be made smaller in size. For example, in the case of the SAW device of FIG. 1, the interval between the first and second SAW elements 2 and 3 can be made smaller, about 30 μm.

Further, the interval between the first and second SAW elements 2 and 3 is preferably about 10 to 70 μm. Accordingly, electromagnetic interference can be reduced between the first and second SAW elements 2 and 3, and the SAW device can be made smaller in size.

Further, by connecting between first SAW element 2 and the second SAW element 3 by the balanced signal lines 16, even in a case where an inductance of the line is included in the connection path of the non-split bus bar electrode 18 of the IDT electrode 5 and the reference potential electrode, impedance matching of the SAW filter can be sufficiently performed.

In the SAW device shown in FIG. 1, the non-split bus bar electrode 18 of the second IDT electrode 5 is connected to the reference potential electrode 18S, and the non-split bus bar electrode 19 of the fifth IDT electrode 8 is made an electrically floating state. Namely, in the case of the SAW device shown in FIG. 1, the reference potential electrode connected to the non-split bus bar electrode 19 is omitted, therefore the device is made smaller in size by that amount.

Note that, in the configuration of FIG. 1, one bus bar electrode belonging to the first IDT electrode 4 is connected to the reference potential (for example, ground potential) through the bus bar electrode of the first reflector electrode 10, and the two bus bar electrodes are arranged in a linear state. Namely, the two bus bar electrodes form a common bus bar electrode 4B. The third IDT electrode 6 and second reflector electrode 11, the fourth IDT electrode 7 and third reflector electrodes 12, and the sixth IDT electrode 9 and fourth reflector electrode 13 individually share common bus bar electrodes 6B, 7B, and 9B in the same way as before. Further, the first IDT electrode 4 has a pair of electrode fingers which are connected to the common bus bar electrode 4B and adjacent to the second IDT electrode 5. The pair of electrode fingers convert unbalanced signals to balanced signals. In the same way, the fourth IDT electrode 7 has a pair of electrode fingers which are connected to the common bus bar electrode 7B and adjacent to the fifth IDT electrode 8.

Figure 2:
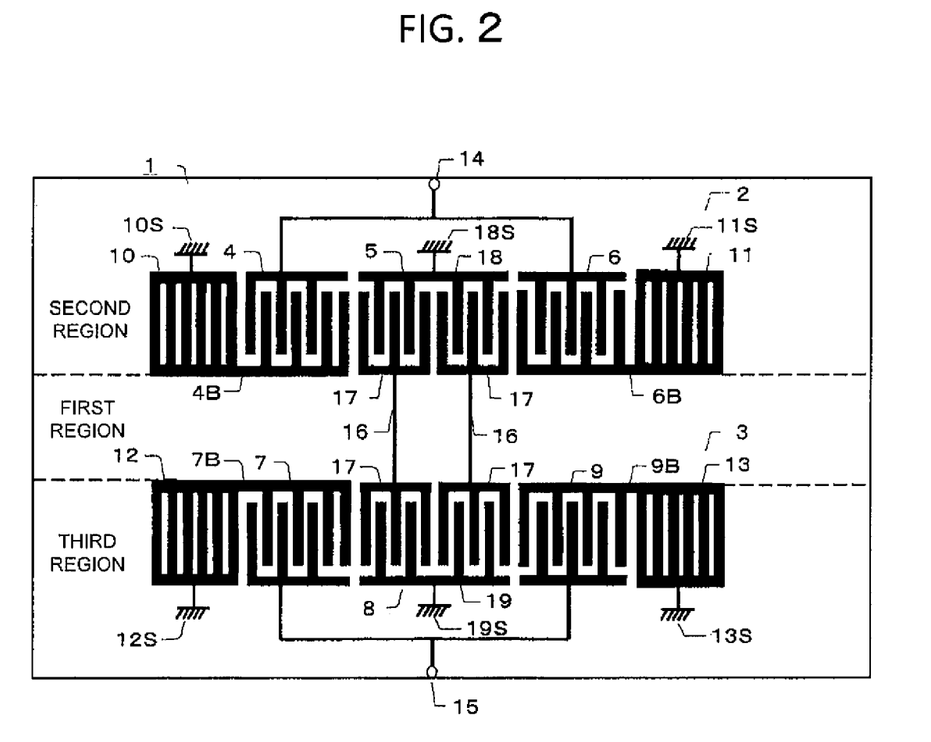
FIG. 2 A plan view showing another example of the SAW device in an embodiment of the present invention.

FIG. 2 shows a plan view of another example of the SAW device in an embodiment of the present invention. In contrast to the SAW device of FIG. 1 in which the fifth IDT electrode 8 located at the center of the second SAW element is not connected to the reference potential electrode (hereinafter, also referred to as a first reference potential electrode), but becomes a floating state, in the SAW device shown in FIG. 2, the non-split bus bar electrode 19 of the fifth IDT electrode 8 located at the center of the second SAW element 3 is connected to the second reference potential electrode 19S.

In the case of the SAW device shown in FIG. 2, the non-split bus bar electrodes 18 and 19 of the second and fifth IDT electrodes 5 and 8 located at the centers of the first and second SAW elements 2 and 3 are individually connected to the first and second reference potential electrodes 18S and 19S, therefore charges generated in the second and fifth IDT electrodes 5 and 8 can be released to the first and second reference potential electrodes 18S and 19S. As a result, the effects of charges exerted between the first SAW element 2 and the second SAW element 3 can be reduced well. Further, the first and second reference potential electrodes 18S and 19S are provided at positions apart from each other, therefore a capacitive component generated between these can be made much smaller. Accordingly, the amount of out-of-band attenuation of the SAW filter can be made larger.

Further, in the SAW device shown in FIG. 2, reference potential electrodes 18S, 10S, and 11S are arranged on the unbalanced signal terminal 14 side, in other words, in the second region of the piezoelectric substrate 1. On the other hand, second reference potential electrodes 19S, 12S, and 13S are arranged on the unbalanced signal terminal 15 side, in other words, in the third region side of the piezoelectric substrate 1.

In this case, the reference potential electrodes 10S, 11S, 12S, 13S, 18S, and 19S are not arranged between the first SAW element 2 and the second SAW element 3, therefore the first SAW element 2 and the second SAW element 3 can be arranged closer, so the SAW device can be made smaller in size.

Figure 3:
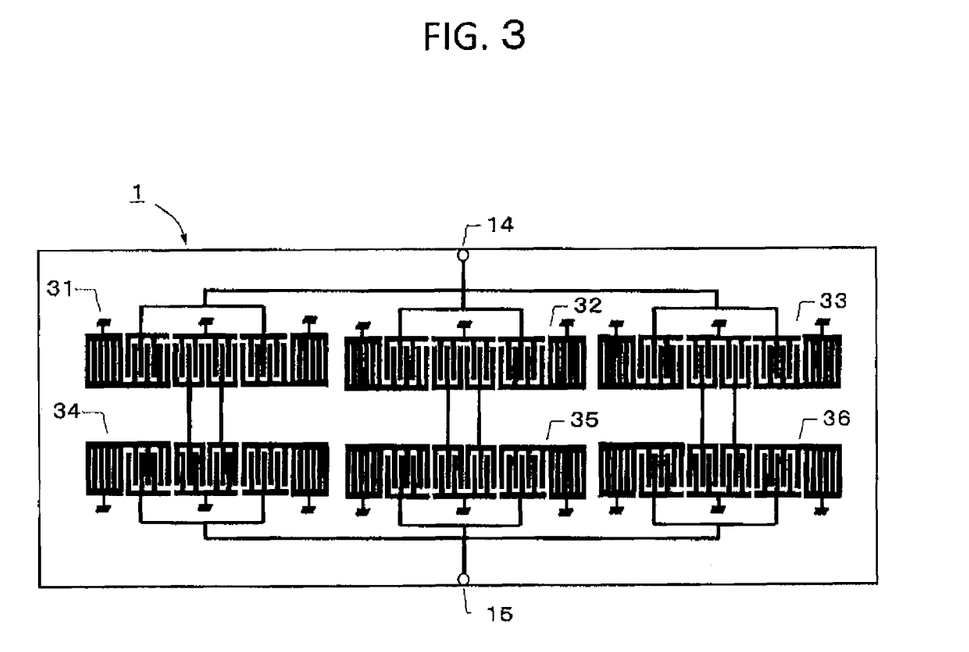
FIG. 3 A plan view showing still another example of the SAW device in an embodiment of the present invention.

FIG. 3 shows a plan view of another example of the SAW device of an embodiment of the present invention. In the configuration of FIG. 3, in the SAW device of FIG. 1, three sets of SAW elements composed of the first and second SAW elements 31 to 36 (a set of 31 and 34, a set of 32 and 35, and a set of 33 and 36) are connected in parallel to the first and second unbalanced signal terminals 14 and 15.

This can greatly increase the amount of out-of-band attenuation. Further, by having an electrode structure in which several sets of the first and second SAW elements 31 to 36 are connected in parallel, the power applied to the SAW elements 31 to 36 can be dispersed, so the power handling capacity of the SAW filter can be improved.

Figure 4:
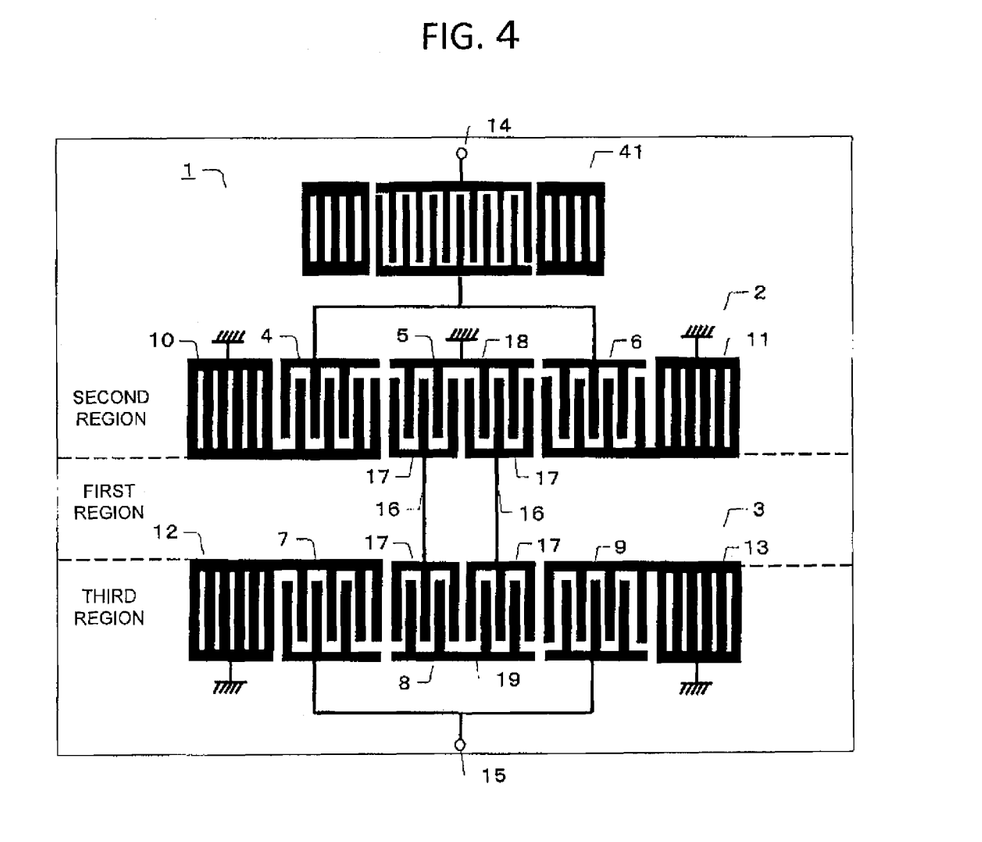
FIG. 4 A plan view showing still another example of the SAW device in an embodiment of the present invention.

FIG. 4 shows a plan view of another example of the SAW device of an embodiment of the present invention. In the configuration of FIG. 4, in the SAW device of FIG. 1, a SAW resonator 41 connected to the first SAW element 2 and to the unbalanced signal terminal 14 is arranged between the first SAW element 2 and the unbalanced signal terminal 14. Accordingly, by appropriately setting an anti-resonance frequency and a resonance frequency of the SAW resonator 41 for the first and second SAW elements 2 and 3, an attenuation pole can be formed at a desired frequency, therefore the amount of out-of-band attenuation can be made larger.

Figure 5:
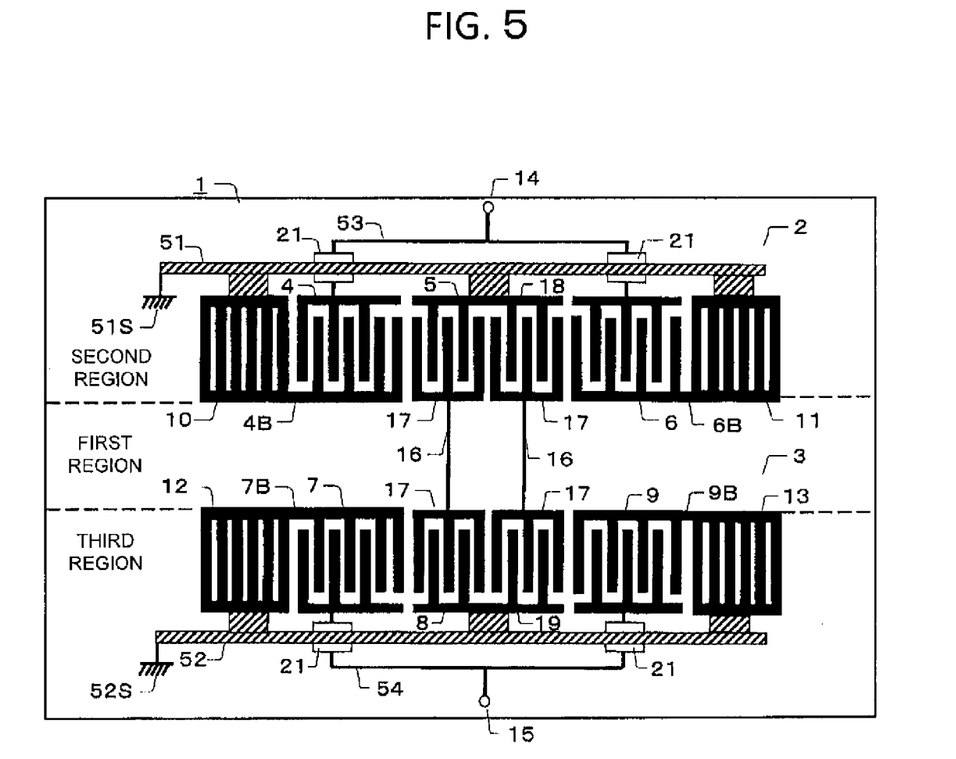
FIG. 5 A plan view showing still another example of the SAW device in an embodiment of the present invention.

FIG. 5 shows a plan view of another example of the SAW device in an embodiment of the present invention. The configuration of FIG. 5 includes the SAW device shown in FIG. 1, in which three-dimensional lines composed of a first reference potential use lead line 51, a first signal lead line 53, a first insulator 21 interposed between the two lead lines 51 and 53, a second reference potential lead line 52, a second signal lead line 54, and a second insulator 21 interposed between the two lead lines 52 and 54 is formed. The reference potential use lead line 51 electrically connects the non-split bus bar electrode 18 of the second IDT electrode 5 of the first SAW element 2 and the first and second reflector electrodes 10 and 11 to a common reference potential electrode 51S. The signal lead line 53 electrically connects the IDT electrodes 4 and 6 arranged at the two sides of the IDT electrode 5 to the first unbalanced signal terminal 14. In the same way, the reference potential use lead line 52 electrically connects the non-split bus bar electrode 19 of the fifth IDT electrode 8 of the second SAW element 3 and third and fourth reflector electrodes 12 and 13 to a common reference potential electrode 52S. The signal lead line 54 electrically connects the IDT electrodes 7 and 9 located on the two sides of the IDT electrode 8 to the second unbalanced signal terminal 15.

Further, in the SAW device of FIG. 1, for example, in the first SAW element 2, the reference potential electrode 18S, reference potential electrode 10S, and reference potential electrode 11S are separately provided. However, in the SAW device shown in FIG. 5, one common reference potential electrode 51S is provided. The second IDT electrode 5 and first and second reflector electrodes 10 and 11 are commonly connected to this common reference potential electrode 51S through the first reference potential use lead line 51. The reference potential electrode is usually formed by a relatively large electrode pad for providing a solder bump etc. In the SAW device shown in FIG. 5, the number of such electrode pads can be decreased. For example, the empty space can be used for arrangement of other electrodes, therefore the degree of freedom of design increases.

In the case of the SAW device shown in FIG. 5, the first and second reference potential use lead lines 51 and 52 cross the first and second signal lead lines 53 and 54, therefore the SAW device can be made smaller in size by this as well.

The three-dimensional lines are formed as follows.

First, on the piezoelectric substrate 1, the first to sixth IDT electrodes 4 to 9 are formed so as to have a thickness of, for example, about 0.1 μm to 0.5 μm. By setting the thickness as above, the SAW elements 2 and 3 can be preferably excited. Simultaneously with the formation of the IDT electrodes, the first to fourth reflector electrodes 10 to 13, signal lead lines 53 and 54, and first and second unbalanced signal terminals 14 and 15 etc. are formed as well.

Next, protective films for covering and protecting the IDT electrodes 4 to 9 etc. are formed. As the material of the protective films, Si, $SiO_2$, SiNx, $Al_2O_3$, etc. can be used. As the film formation method, a sputtering method, a CVD (chemical vapor deposition) method, an electron beam vapor deposition method, or the like can be used.

Next, first and second insulators 21 are formed at portions in the first and second signal lead lines 53 and 54, where the first and second reference potential use lead lines 51 and 52 are to cross. As the material of the first and second insulators 21, a photosensitive polyimide resin, non-photosensitive polyimide resin, $SiO_2$, SiNx, $Al_2O_3$, etc. can be used. As the method of formation of the first and second insulators 21, a method of forming a resin film by a spin coating method, then performing photolithography to obtain a desired pattern can be employed. Further, as the method of formation where $SiO_2$, SiNx, $Al_2O_3$, or the like is used as the material of the first and second insulators 21, a sputtering method, a CVD (chemical vapor deposition) method, or the like can be used.

After forming the first and second insulators 21, the first and second reference potential use lead lines 51 and 52 are formed by patterning a film formed according to the sputtering method or the like. The three-dimensional lines are formed in this way.

Figure 7:
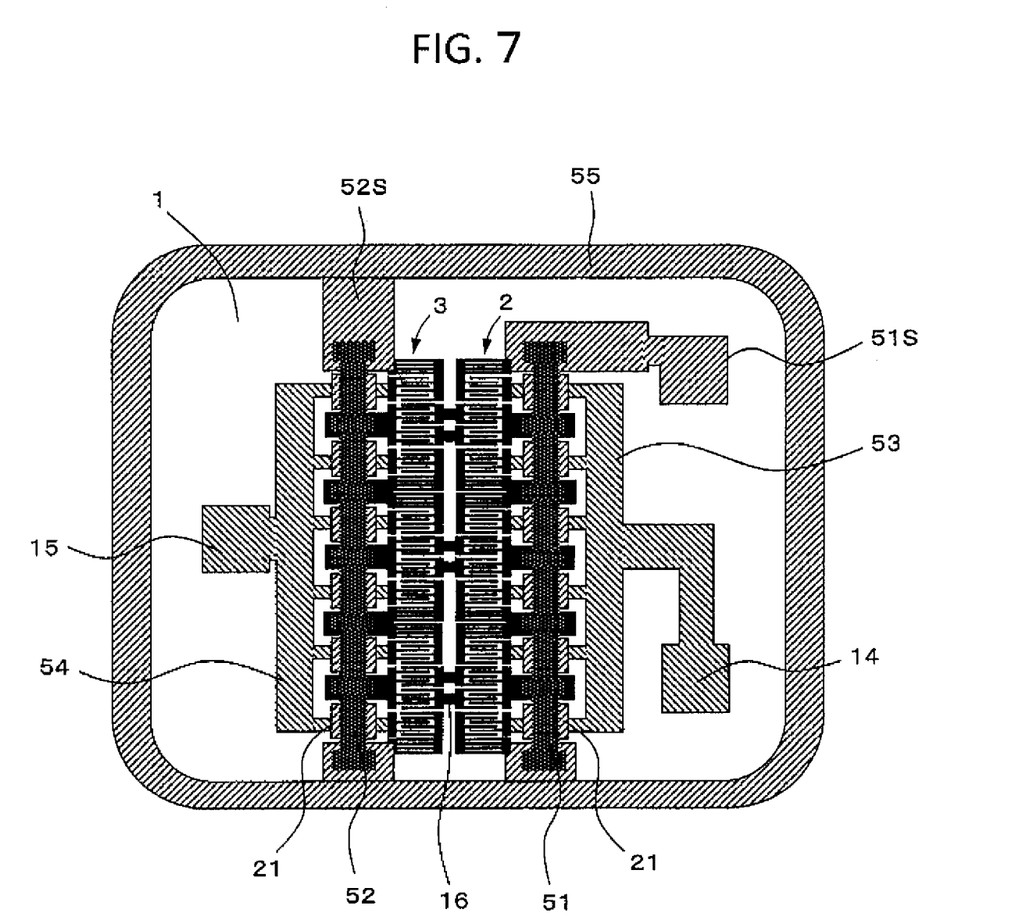
FIG. 7 A plan view showing a filter configured by using the SAW device shown in FIG. 5.

FIG. 7 shows a plan view of a SAW filter constituted by the SAW device shown in FIG. 5. Note that, the SAW filter shown in FIG. 7 shows a case where there are three sets of SAW devices each comprising a set of the first SAW element 2 and the second SAW element 3. As shown in FIG. 7, in each set, in the space between the SAW element 2 and the SAW element 3, no reference potential use electrode is arranged, therefore formation of unrequired capacitance is reduced, so a SAW filter excellent in electric characteristics can be obtained. Further, in the SAW filter shown in FIG. 7, the first and second reference potential lead lines 51 and 52 and the first and second signal lead lines 53 and 54 are insulated via the first and second insulators 21, therefore the length of these lead lines 51, 52, 53, and 54 can be made shorter, so the SAW filter can be made smaller in size.

Note that, as the piezoelectric substrate 1 for the SAW filter, preferably, a 36°±3° Y-cut X-propagation lithium tantalite single crystal, a 42°±3° Y-cut X-propagation lithium tantalite single crystal, a 64°±3° Y-cut X-propagation lithium niobate single crystal, a 41°±3° Y-cut X-propagation lithium niobate single crystal, or a 45°±3° X-cut Z-propagation lithium tetraborate single crystal is used. This is because, these have large electromechanical coupling coefficients and small frequency temperature coefficients. Further, among these pyroelectric piezoelectric single crystals, use of a pyroelectric piezoelectric single crystal having pyroelectricity remarkably reduced by oxygen defects or solid solution of Fe or the like is good for the reliability of the SAW device. The thickness of the piezoelectric substrate 1 is preferably about 0.1 to 0.5 mm. If it is less than 0.1 mm, the piezoelectric substrate 1 becomes brittle. If it exceeds 0.5 mm, the material costs and part dimension become large, so the result is not suitable for use.

Further, the IDT electrodes and reflector electrodes are composed of Al or an Al alloy (Al—Cu-based or Al—Ti-based) and are formed by a vapor deposition method, a sputtering method, a CVD method, or other thin film formation method. An electrode thickness set to about 0.1 to 0.5 μm is preferred for obtaining the desired characteristics of the SAW filter.

Further, by forming $SiO_2$, SiNx, Si, and $Al_2O_3$ as the protective film at each electrode and propagation portion of the SAW on the piezoelectric substrate 1, conduction due to conductive foreign substances can be prevented and the power handling capacity can be improved.

Note that, in the SAW filter shown in FIG. 7, a ring-shaped conductor 55 surrounding the first and second SAW elements 2 and 3 etc. is provided. The ring-shaped conductor 55 is kept at the ground potential when using the SAW filter. Thus, the effect of the outside unrequired electromagnetic waves on the SAW elements 2 and 3 etc. can be made smaller, and the electrical characteristics of the SAW filter can be improved.

The SAW device of the present, invention can be applied to a mobile phone terminal or other communication device.

Figure 9:
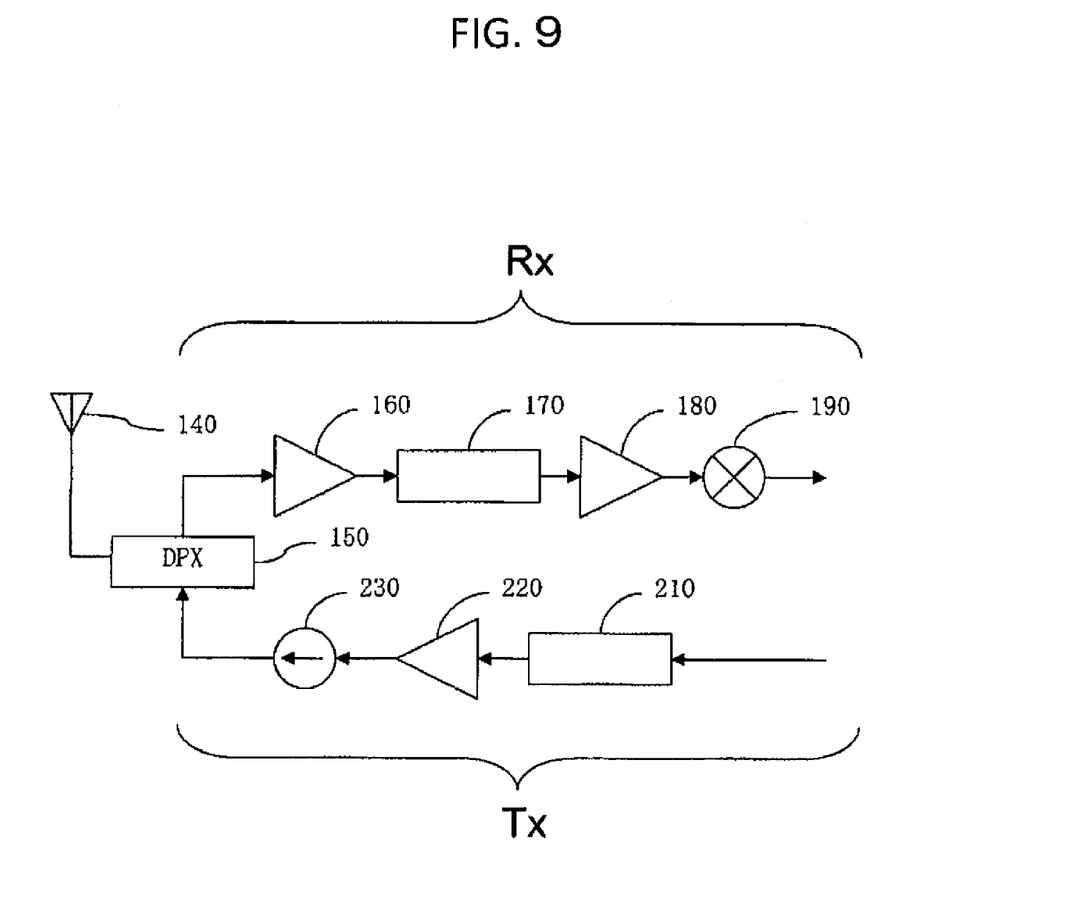
FIG. 9 A block circuit diagram of a communication device according to an embodiment of the present invention.

FIG. 9 is a block diagram showing a communication device according to an embodiment of the present invention. In FIG. 9, a transmission circuit Tx and a reception circuit Rx are connected to an antenna 140 via a branching filter 150. As the filter constituting this branching filter 150 or filter 170 of the reception circuit Rx or filter 210 of the transmission circuit Tx, for example, the SAW devices shown in FIG. 1 to FIG. 5 can be used.

A high frequency signal transmitted at the communication device shown in FIG. 9 is stripped of the unrequired signal by the filter 210 and amplified by a power amplifier 220. After that, the amplified high frequency signal passes through an isolator 230 and the branching filter 150 and is emitted from the antenna 140. Further, the high frequency signal received at the antenna 140 passes through the branching filter 150 and is amplified by the low noise amplifier 160, stripped of the unrequired signal by the filter 170, then amplified again by the amplifier 180 and converted to a low frequency signal by the mixer 190.

Embodiment 1

An embodiment of the SAW device of the present invention is explained below. An embodiment of specifically preparing a SAW device shown in FIG. 2 is explained.

On the piezoelectric substrate (mother board for providing many units) 1 composed of a 38.7° Y-cut and X-direction propagation $LiTaO_3$ single crystal, fine electrode patterns were formed as the IDT electrodes 4 to 9 and the reflector electrodes 10 to 13 composed of Al (99 vol %)-Cu (1 vol %) alloy.

Further, the electrodes were patterned using a sputtering apparatus, a reduced projection exposure apparatus (stepper), and an RIE (reactive ion etching) apparatus by a photolithography method.

First, the piezoelectric substrate 1 was ultrasonically cleaned by acetone, IPA (isopropyl alcohol), or the like to remove organic ingredients. Next, the piezoelectric substrate 1 was sufficiently dried by a clean oven, then a metal layer for forming the electrodes was formed by film formation. For the formation of the metal layer, a sputtering apparatus was used.

Al (99 vol %)-Cu (1 vol %) alloy was used as the material of the metal layer. The thickness of the metal layer at this time was set to about 0.15 μm.

Next, a photo-resist layer was spin-coated on the metal layer to a thickness of about 0.5 μm, patterned to a desired shape by a reduced projection exposure apparatus (stepper), then stripped of the unrequired portions of the photo-resist layer by an alkali developer by a developer apparatus to expose the desired pattern. After that, the metal layer was etched by an RIE apparatus, the patterning was ended, and patterns of electrodes constituting the SAW device were obtained.

After this, a protective film was formed on a predetermined region of the electrode. Namely, a CVD (chemical vapor deposition) apparatus was used to form patterns of electrodes and the $SiO_2$ layer on the piezoelectric substrate 1 to a thickness of about 0.02 μm.

After that, the photolithography method was used for patterning and an RIE apparatus etc. was used for, etching a flip-chip window opening. After that, the flip-chip window opening is formed with a pad electrode composed of a Cr layer, Ni layer, and Au layer using the sputtering apparatus. The thickness of the pad electrode at this time was controlled to about 1.0 μm. After that a printing method and a reflow furnace were used to form solder bumps on the pad electrodes for flip chip mounting of the SAW device on an external circuit board or the like.

Next, the piezoelectric substrate 1 was diced along separation lines to split it into the individual SAW devices (chips). After that, each chip was placed in an external package with the surface of formation of the pad electrodes facing down and bonded by a flip chip mounting apparatus. After that, each package was baked in an $N_2$ gas atmosphere to complete a packaged SAW device. As the package, one with a 2.5×2.0 mm square laminate structure formed by stacking ceramic layers in multiple layers was used.

Further, as the sample of Comparative Example 1, in the configuration of FIG. 2, a SAW device in which non-split bus bar electrodes 18 and 19 of the IDT electrodes 5 and 8 of the SAW elements 2 and 3 were not connected to the reference potential electrodes, but became electrically floating in state was used. The rest of the configuration of Comparative Sample 1 was the same as the configuration of FIG. 2.

Next, the characteristics of the SAW devices according to the present embodiment and comparative example were found by computer simulation. The operation frequency of the SAW device was 700 to 6000 MHz.

Figure 6:
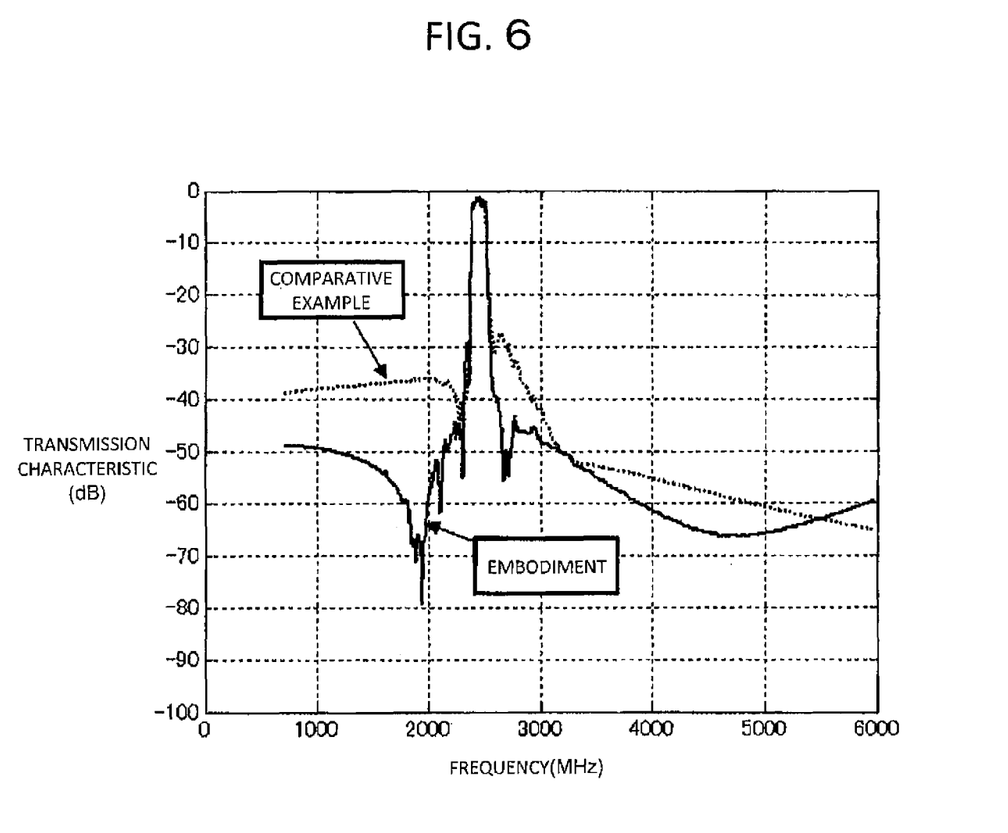
FIG. 6 A graph showing frequency characteristics of transmission characteristics in a pass band and in the vicinity of that for a SAW device of an embodiment of the present invention and a SAW device of a comparative example.

A graph of the frequency characteristics in the vicinity of the pass band is shown in FIG. 6. FIG. 6 is a graph showing the frequency dependency of transmission characteristics representing pass characteristics of the filter. The filter characteristics of the present embodiment were very good. Namely, in comparison with the SAW filter of the comparative example indicated by the broken line in FIG. 6, as indicated by the solid line in FIG. 6, the amount of out-of-band attenuation of the SAW filter in the present embodiment greatly increased.

Further, as the sample of Comparative Example 2, a SAW device having the configuration of FIG. 8 was prepared. In this SAW device, the interval between a first SAW element 91 and a second SAW element 92 was 100 μm. On the other hand, in the SAW device of the present embodiment, the interval between the first SAW element 2 and the second SAW element 3 was 30 μm. As a result, the area of the SAW device of the present embodiment became 5300 $μm^2$, and the area of the SAW device of Comparative Example 2 became 68900 $μm^2$, so the SAW device of the present embodiment was reduced in size by 20% in area ratio.

In this way, according to the present embodiment, the amount of out-of-band attenuation was greatly increased, and a small-sized SAW device was realized.

The invention claimed is:

1. A surface acoustic wave device, comprising:
a piezoelectric substrate comprising a first region, a second region and a third region, the second and third regions arranged adjoining both sides of the first region;
a first surface acoustic wave element in the second region on the piezoelectric substrate, in which first, second and third IDT electrodes are sequentially arranged along a direction of propagation of the surface acoustic wave propagated on the piezoelectric substrate, the second IDT electrode arranged at the center among the first, second and third IDT electrodes comprising first split bus bar electrodes arranged on the first region side on the piezoelectric substrate and split into two and a non-split bus bar electrode arranged in the second region on the piezoelectric substrate and connected to a reference potential electrode arranged in the second region;
a second surface acoustic wave element in the third region on the piezoelectric substrate, in which fourth, fifth and sixth IDT electrodes are sequentially arranged along the direction of propagation of the surface acoustic wave propagated on the piezoelectric substrate, the fifth IDT electrode arranged at the center among the fourth, fifth and sixth IDT electrodes comprising second split bus bar electrodes arranged on the first region side so as to adjoin the first split bus bar electrodes and a non-split bus bar electrode arranged in the third region on the piezoelectric substrate;
balanced signal lines arranged in the first region and connecting the first split bus bar electrodes and the second split bus bar electrodes so as to make cascade connection between the first and second surface acoustic wave elements;
a first unbalanced signal terminal connected to the first and third IDT electrodes of the first surface acoustic wave element and arranged in the second region; and
a second unbalanced signal terminal connected to the fourth and sixth IDT electrodes of the second surface acoustic wave element and arranged in the third region,
wherein the non-split bus bar electrode of the fifth IDT electrode is in an electrically floating state.

2. The surface acoustic wave device according to claim 1, further comprising a plurality of sets each comprising the first and second surface acoustic wave elements,
wherein the plurality of sets are connected in parallel to the first and second unbalanced signal terminals.

3. The surface acoustic wave device according to claim 1, further comprising a surface acoustic wave resonator which is connected between the first surface acoustic wave element and the first unbalanced signal terminal or between the second surface acoustic wave element and the second unbalanced signal terminal.

4. The surface acoustic wave device according to claim 1, further comprising first and second reflector electrodes disposed on both sides of the first, second and third IDT electrodes arranged in the direction of propagation,
wherein the non-split bus bar electrode of the second IDT electrode of the first surface acoustic wave element and the first and second reflector electrodes are connected to the reference potential electrode via a lead out line for a reference potential, and a signal lead out line connecting the first and third IDT electrodes to the first unbalanced signal terminal crosses the lead out line for a reference potential with an insulator interposed therebetween.

5. The surface acoustic wave device according to claim 1, further comprising first and second reflector electrodes disposed on both sides of the first, second and third IDT electrodes arranged in the direction of propagation,
wherein the first IDT electrode and the first reflector electrode are connected by a first common bus bar electrode, and the third IDT electrode and the second reflector electrode are connected by a second common bus bar electrode.

6. The surface acoustic wave device according to claim 5, wherein the first and third IDT electrodes are connected to the reference potential electrode to which the non-split bus bar electrode of the second IDT electrode is connected.

7. The surface acoustic wave device according to claim 1, wherein an interval between the first and second surface acoustic wave elements is 10 to 70 µm.

8. A communication device, comprising
at least one of a reception circuit and a transmission circuit which has a surface acoustic wave device,
wherein the surface acoustic wave device comprises
a piezoelectric substrate comprising a first region, a second region and a third region, the second and third regions arranged adjoining the both sides of the first region;
a first surface acoustic wave element in the second region on the piezoelectric substrate, in which first, second and third IDT electrodes are arranged along a direction of propagation of a surface acoustic wave propagated on the piezoelectric substrate, the second IDT electrode arranged at the center among the first, second and third IDT electrodes comprising first split bus bar electrodes arranged on the first region side on the piezoelectric substrate and split into two and a non-split bus bar electrode arranged on the second region side on the piezoelectric substrate and connected to a reference potential electrode,
a second surface acoustic wave element in the third region on the piezoelectric substrate, in which fourth, fifth and sixth IDT electrodes are arranged along the direction of propagation of the surface acoustic wave propagated on the piezoelectric substrate, the fifth IDT electrode arranged at the center among the fourth, fifth and sixth IDT electrodes comprising second split bus bar electrodes arranged on the first region side so as to adjoin the first split bus bar electrodes and a non-split bus bar electrode arranged on the third region side on the piezoelectric substrate;
balanced signal lines arranged in the first region and connecting the first split bus bar electrodes and the second split bus bar electrodes so as to cascade-connect the first and second surface acoustic wave elements;
a first unbalanced signal terminal connected to the second and third IDT electrodes of the first surface acoustic wave element and arranged in the second region; and
a second unbalanced signal terminal connected to the fourth and sixth IDT electrodes of the second surface acoustic wave element and arranged in the third region; and
first and second reflector electrodes disposed on both sides of the first, second and third IDT electrodes arranged in the direction of propagation,
wherein the non-split bus bar electrode of the second IDT electrode of the first surface acoustic wave element and the first and second reflector electrodes are connected to the reference potential electrode via a lead out line for a reference potential, and a signal lead out line connecting the first and third IDT electrodes to the first unbalanced signal terminal crosses the lead out line for a reference potential with an insulator interposed therebetween.

9. The communication device according to claim 8, wherein the transmission circuit comprises
a mixer configured to superimpose a transmission signal on a carrier frequency,
a power amplifier configured to amplify the transmission signal, and
a branching filter configured to transmit the transmission signal amplified to an antenna and comprising the surface acoustic wave device.

10. The communication device according to claim 8, wherein the reception circuit comprises
a branching filter configured to transmit the reception signal received at an antenna toward a reception signal processing circuit and comprising the surface acoustic wave device,
a low noise amplifier configured to amplify the reception signal, and
a mixer configured to demultiplex the reception signal from the carrier frequency.

11. A surface acoustic wave device, comprising:
a piezoelectric substrate comprising a first region, a second region and a third region, the second and third regions arranged adjoining both sides of the first region;
a first surface acoustic wave element in the second region on the piezoelectric substrate, in which first, second and third IDT electrodes are sequentially arranged along a direction of propagation of the surface acoustic wave propagated on the piezoelectric substrate, the second IDT electrode arranged at the center among the first, second and third IDT electrodes comprising first split bus bar electrodes arranged on the first region side on the piezoelectric substrate and split into two and a non-split bus bar electrode arranged in the second region on the piezoelectric substrate and connected to a reference potential electrode arranged in the second region;
a second surface acoustic wave element in the third region on the piezoelectric substrate, in which fourth, fifth and sixth IDT electrodes are sequentially arranged along the direction of propagation of the surface acoustic wave propagated on the piezoelectric substrate, the fifth IDT electrode arranged at the center among the fourth, fifth and sixth IDT electrodes comprising second split bus bar electrodes arranged on the first region side so as to adjoin the first split bus bar electrodes and a non-split bus bar electrode arranged in the third region on the piezoelectric substrate;
balanced signal lines arranged in the first region and connecting the first split bus bar electrodes and the second split bus bar electrodes so as to make cascade connection between the first and second surface acoustic wave elements;
a first unbalanced signal terminal connected to the first and third IDT electrodes of the first surface acoustic wave element and arranged in the second region;
a second unbalanced signal terminal connected to the fourth and sixth IDT electrodes of the second surface acoustic wave element and arranged in the third region; and
first and second reflector electrodes disposed on both sides of the first, second and third IDT electrodes arranged in the direction of propagation, wherein the non-split bus bar electrode of the second IDT electrode of the first surface acoustic wave element and the first and second reflector electrodes are connected to the reference potential electrode via a lead out line for a reference potential, and a signal lead out line connecting the first and third IDT electrodes to the first unbalanced signal terminal crosses the lead out line for a reference potential with an insulator interposed therebetween.

12. The surface acoustic wave device according to claim 11, wherein the non-split bus bar electrode of the fifth IDT electrode is connected to a second reference potential electrode arranged in the third region.

13. The surface acoustic wave device according to claim 11,
further comprising a plurality of sets each comprising the first and second surface acoustic wave elements,
wherein the plurality of sets are connected in parallel to the first and second unbalanced signal terminals.

14. The surface acoustic wave device according to claim 11, further comprising a surface acoustic wave resonator which is connected between the first surface acoustic wave element and the first unbalanced signal terminal or between the second surface acoustic wave element and the second unbalanced signal terminal.

15. The surface acoustic wave device according to claim 11,
further comprising first and second reflector electrodes disposed on both sides of the first, second and third IDT electrodes arranged in the direction of propagation,
wherein the first IDT electrode and the first reflector electrode are connected by a first common bus bar electrode, and the third IDT electrode and the second reflector electrode are connected by a second common bus bar electrode.

16. The surface acoustic wave device according to claim 15, wherein the first and third IDT electrodes are connected to the reference potential electrode to which the non-split bus bar electrode of the second IDT electrode is connected.

17. The surface acoustic wave device according to claim 11, wherein an interval between the first and second surface acoustic wave elements is 10 to 70 µm.

* * * * *